(12) United States Patent
Lee et al.

(10) Patent No.: US 10,046,589 B2
(45) Date of Patent: Aug. 14, 2018

(54) HYBRID SECURITY DEVICE FOR SECURITY DOCUMENT OR TOKEN

(71) Applicant: Innovia Security Pty Ltd, Craigieburn, Victoria (AU)

(72) Inventors: Robert Arthur Lee, Craigieburn (AU); Michael Hardwick, Craigieburn (AU)

(73) Assignee: CCL Secure Pty Ltd, Craigieburn, Victoria (AU)

( * ) Notice: Subject to any disclaimer, the term of this patent is extended or adjusted under 35 U.S.C. 154(b) by 0 days.

(21) Appl. No.: 15/311,725

(22) PCT Filed: Apr. 22, 2015

(86) PCT No.: PCT/AU2015/050188
§ 371 (c)(1),
(2) Date: Nov. 16, 2016

(87) PCT Pub. No.: WO2015/172190
PCT Pub. Date: Nov. 19, 2015

(65) Prior Publication Data
US 2017/0106690 A1     Apr. 20, 2017

(30) Foreign Application Priority Data

May 16, 2014   (AU) ................................ 2014100511
May 16, 2014   (AU) ................................ 2014901816

(51) Int. Cl.
*G02B 5/02*     (2006.01)
*B42D 15/00*    (2006.01)
(Continued)

(52) U.S. Cl.
CPC ........... *B42D 25/328* (2014.10); *B42D 25/21* (2014.10); *B42D 25/324* (2014.10); *B42D 25/42* (2014.10);
(Continued)

(58) Field of Classification Search
CPC .. B42D 25/328; B42D 25/29; B42D 2035/24; G03H 1/0011; G03H 1/0244; G03H 1/0236; G07D 7/0032
(Continued)

(56) References Cited

U.S. PATENT DOCUMENTS 4,113,895 A     9/1978  Watt et al.
5,694,229 A  *  12/1997  Drinkwater ............ G02B 27/60
                                                         283/94
(Continued)

FOREIGN PATENT DOCUMENTS

CA        2645246        10/2007
JP        2008107469      5/2008
(Continued)

OTHER PUBLICATIONS

International Search Report for PCT/AU2015/050188 dated Jul. 17, 2015.
Written Opinion for PCT/AU2015/050188 dated Jul. 17, 2015.

*Primary Examiner* — Shin H Kim
(74) *Attorney, Agent, or Firm* — Christopher M. Scherer; DeWitt Ross & Stevens S.C.

(57) ABSTRACT

A hybrid security device for security documents and the like, with the microstructure for a first optically variable device (OVD) and the microstructure for a second OVD mutually interlace or interspersed. The first microstructure has a height profile that differs from that of the second microstructure by more than 0.5 microns. Suitable fabrication processes for the hybrid security device are also disclosed.

18 Claims, 11 Drawing Sheets

(51) Int. Cl.
*B42D 25/328* (2014.01)
*B42D 25/324* (2014.01)
*B42D 25/42* (2014.01)
*B42D 25/425* (2014.01)
*B42D 25/21* (2014.01)
*G03F 7/00* (2006.01)
*G02B 5/18* (2006.01)

(52) U.S. Cl.
CPC ......... *B42D 25/425* (2014.10); *G02B 5/1857* (2013.01); *G03F 7/0035* (2013.01)

(58) Field of Classification Search
USPC .................................................. 283/85; 359/2
See application file for complete search history.

(56) References Cited

U.S. PATENT DOCUMENTS

| | | | | |
|---|---|---|---|---|
| 6,369,919 | B1 * | 4/2002 | Drinkwater | G03H 1/265 283/86 |
| 7,199,911 | B2 * | 4/2007 | Hudson | G03H 1/18 283/86 |
| 7,281,810 | B2 * | 10/2007 | Lee | B44F 1/10 283/85 |
| 7,808,605 | B2 | 10/2010 | Hoffmuller et al. | |
| 7,839,546 | B2 * | 11/2010 | Holmes | G03H 1/041 283/86 |
| 8,025,952 | B2 * | 9/2011 | Raksha | B42D 25/369 283/109 |
| 8,276,945 | B2 * | 10/2012 | Heim | B42D 25/351 283/81 |
| 8,613,471 | B2 * | 12/2013 | Heim | B42D 25/29 283/72 |
| 8,625,181 | B2 * | 1/2014 | Holmes | G03H 1/028 283/85 |
| 8,840,146 | B2 * | 9/2014 | Stalder | G02B 5/0221 283/85 |
| 2013/0147180 | A1 | 6/2013 | Batistatos et al. | |

FOREIGN PATENT DOCUMENTS

| | | |
|---|---|---|
| WO | 2005070693 | 8/2005 |
| WO | 2006021568 | 3/2006 |
| WO | 2007083140 | 7/2007 |
| WO | 2011017741 | 2/2011 |

* cited by examiner

HYBRID SECURITY DEVICE FOR SECURITY DOCUMENT OR TOKEN

CROSS REFERENCE TO RELATED APPLICATIONS

The present application is the U.S. national stage application of International Application PCT/AU2015/050188, filed Apr. 22, 2015, which international application was published on Nov. 19, 2015, as International Publication WO2015/172190. The International Application claims priority of Australian Patent Application No. 2014100511, filed May 16, 2014, and Australian Patent Application No. 2014901816, filed May 16, 2014, the contents of which are incorporated herein by reference in their entireties.

FIELD OF THE INVENTION

The invention relates to security devices applied to security documents or tokens as a counterfeit deterrent. The invention also relates to production methods used for manufacturing these security devices and subsequently applying them to security documents or tokens.

DEFINITIONS

Security Document or Token

As used herein the term security documents and tokens includes all types of documents and tokens of value and identification documents including, but not limited to the following: items of currency such as banknotes and coins, credit cards, cheques, passports, identity cards, securities and share certificates, driver's licenses, deeds of title, travel documents such as airline and train tickets, entrance cards and tickets, birth, death and marriage certificates, and academic transcripts.

The invention is particularly, but not exclusively, applicable to security documents or tokens such as banknotes or identification documents such as identity cards or passports formed from a substrate to which one or more layers of printing are applied. The diffraction gratings and optically variable devices described herein may also have application in other products, such as packaging.

Security Device or Feature

As used herein the term security device or feature includes any one of a large number of security devices, elements or features intended to protect the security document or token from counterfeiting, copying, alteration or tampering. Security devices or features may be provided in or on the substrate of the security document or in or on one or more layers applied to the base substrate, and may take a wide variety of forms, such as security threads embedded in layers of the security document; security inks such as fluorescent, luminescent and phosphorescent inks, metallic inks, iridescent inks, photochromic, thermochromic, hydrochromic or piezochromic inks; printed and embossed features, including relief structures; interference layers; liquid crystal devices; lenses and lenticular structures; optically variable devices (OVDs) such as diffractive devices including diffraction gratings, holograms, diffractive optical elements (DOEs) and micromirror array devices (see for example U.S. Pat. No. 7,281,810).

Substrate

As used herein, the term substrate refers to the base material from which the security document or token is formed. The base material may be paper or other fibrous material such as cellulose; a plastic or polymeric material including but not limited to polypropylene (PP), polyethylene (PE), polycarbonate (PC), polyvinyl chloride (PVC), polyethylene terephthalate (PET), biaxially-oriented polypropylene (BOPP); or a composite material of two or more materials, such as a laminate of paper and at least one plastic material, or of two or more polymeric materials.

Optically Variable Image or Device (OVD)

An optically variable image or device is a security feature or device that changes in appearance. OVDs provide an optically variable effect when the banknote is tilted and/or when the viewing angle of the observer relative to the OVD changes. The image of an OVD may also be changed by aligning a verification device over the security feature or device. An OVD may be provided by a printed area, e.g. an area printed with metallic inks or iridescent inks, by an embossed area, and by a combination of a printed and embossed feature. An OVD may also be provided by a diffractive device, such as a diffraction grating or a hologram and may include arrays of microlenses and lenticular lenses.

Diffractive Optical Elements (DOEs)

As used herein, the term diffractive optical element refers to a numerical-type diffractive optical element (DOE). Numerical-type diffractive optical elements (DOEs) rely on the mapping of complex data that reconstruct in the far field (or reconstruction plane) a two-dimensional intensity pattern. Thus, when substantially collimated light, e.g. from a point light source or a laser, is incident upon the DOE, an interference pattern is generated that produces a projected image in the reconstruction plane that is visible when a suitable viewing surface is located in the reconstruction plane, or when the DOE is viewed in transmission at the reconstruction plane. The transformation between the two planes can be approximated by a fast Fourier transform (FFT). Thus, complex data including amplitude and phase information has to be physically encoded in the microstructure of the DOE. This DOE data can be calculated by performing an inverse FFT transformation of the desired reconstruction (i.e. the desired intensity pattern in the far field).

DOEs are sometimes referred to as computer-generated holograms, but they differ from other types of holograms, such as rainbow holograms, Fresnel holograms and volume reflection holograms.

Embossable Radiation Curable Ink

The term embossable radiation curable ink used herein refers to any ink, lacquer or other coating which may be applied to the substrate in a printing process, and which can be embossed while soft to form a relief structure and cured by radiation to fix the embossed relief structure. The curing process does not take place before the radiation curable ink is embossed, but it is possible for the curing process to take place either after embossing or at substantially the same time as the embossing step. The radiation curable ink is preferably curable by ultraviolet (UV) radiation. Alternatively, the radiation curable ink may be cured by other forms of radiation, such as electron beams or X-rays.

The radiation curable ink is preferably a transparent or translucent ink formed from a clear resin material. Such a transparent or translucent ink is particularly suitable for printing light-transmissive security elements such as sub-wavelength gratings, transmissive diffractive gratings and lens structures.

In one particularly preferred embodiment, the transparent or translucent ink preferably comprises an acrylic based UV curable clear embossable lacquer or coating.

Such UV curable lacquers can be obtained from various manufacturers, including Kingfisher Ink Limited, product ultraviolet type UVF-203 or similar. Alternatively, the radiation curable embossable coatings may be based on other compounds, eg nitro-cellulose.

The radiation curable inks and lacquers used herein have been found to be particularly suitable for embossing microstructures, including diffractive structures such as diffraction gratings and holograms, and microlenses and lens arrays. However, they may also be embossed with larger relief structures, such as non-diffractive optically variable devices.

The ink is preferably embossed and cured by ultraviolet (UV) radiation at substantially the same time. In a particularly preferred embodiment, the radiation curable ink is applied and embossed at substantially the same time in a Gravure printing process.

Preferably, in order to be suitable for Gravure printing, the radiation curable ink has a viscosity falling substantially in the range from about 20 to about 175 centipoise, and more preferably from about 30 to about 150 centipoise. The viscosity may be determined by measuring the time to drain the lacquer from a Zahn Cup #2. A sample which drains in 20 seconds has a viscosity of 30 centipoise, and a sample which drains in 63 seconds has a viscosity of 150 centipoise.

With some polymeric substrates, it may be necessary to apply an intermediate layer to the substrate before the radiation curable ink is applied to improve the adhesion of the embossed structure formed by the ink to the substrate. The intermediate layer preferably comprises a primer layer, and more preferably the primer layer includes a polyethylene imine. The primer layer may also include a cross-linker, for example a multi-functional isocyanate. Examples of other primers suitable for use in the invention include: hydroxyl terminated polymers; hydroxyl terminated polyester based co-polymers; cross-linked or uncross-linked hydroxylated acrylates; polyurethanes; and UV curing anionic or cationic acrylates. Examples of suitable cross-linkers include: isocyanates; polyaziridines; zirconium complexes; aluminium acetylacetone; melamines; and carbodiimides.

Overt Security Devices

Overt security devices are those which are apparent to a person handling the banknote and include devices such as security threads embedded in layers of the security document and visible at least in transmission when a person holds the security document up to the light; printed features which are visible in reflection and/or transmission; embossed features, including relief structures, which may be tactile so that they can be detected by a person feeling the tactile area of the note; and optically variable devices (OVDs). OVDs provide an optically variable effect when the banknote is tilted and/or when the viewing angle of the observer relative to the OVD changes. An OVD may be provided by a printed area, eg an area printed with metallic inks or iridescent inks, by an embossed area, and by a combination of a printed and embossed feature. An OVD may also be provided by a diffractive device, such as a diffraction grating or a hologram.

Covert Security Devices

A covert security device is one which is not apparent to a person handling the banknote without the use of external verification or authentication means. Covert security devices include features such as microprinting, which requires a magnifying lens to authenticate the microprinting; and features formed by photoluminescent inks and phosphorescent inks which require illumination by electromagnetic radiation of a particular wavelength, eg infra-red (IR) or ultraviolet (UV) radiation, for the ink to luminesce or phosphoresce; and photochromic, thermochromic, hydrochromic or piezochromic inks.

BACKGROUND OF THE INVENTION

A variety of security devices are applied to security documents and tokens to deter counterfeiters. For example, banknotes may have a relief structure embossed into a layer of radiation curable ink. It is also known to make security devices with diffractive optical elements (DOE's) by embossing the radiation curable ink with a metal shim. The metal shim has a surface relief structure that is the negative of the desired micro-scale or nano-scale diffractive structure. The embossed radiation curable ink is then exposed to radiation so that it cures and permanently sets the diffractive structure.

The metal shim is typically formed from an 'originating master' as it is known. The originating master has the diffractive microstructure formed on one surface of a plate. The diffractive microstructure is usually a layer of photoresist polymer that has been masked, exposed to radiation of a particular wavelength and subsequently etched or 'developed'.

The photolithographic etching process begins with a suitable photo sensitive polymer (known as photoresist) 'spun' onto a substrate plate. The plate is literally spun so that the layer of photoresist deposited on the surface has a uniform thickness.

Next an opaque mask is normally applied to the photoresist layer (maskless lithographic techniques are also discussed below). The mask has openings in the regions where photoresist is to be removed. The photoresist is exposed to radiation (usually UV light) through the mask, such that the exposed areas are chemically altered. The mask is removed and a chemical etchant is used to remove the exposed photoresist such that the unexposed portions remain. This type of photoresist is referred to as 'positive' photoresist and is the most common type of photoresist used in photolithography. Simultaneously exposing large areas of photoresist to UV light and subsequent development with an etchant provides a high throughput process for precise fabrication microstructures.

While there can be some variation in height of the microstructures, it is preferable to keep the height, and height profile of all the features relatively uniform. The term 'height' refers to the maximum height of the microstructures above the underlying substrate. The term 'height profile' refers to the height difference between the topmost and bottommost part of the microstructure features. Of course, reference to terms such as 'top', 'bottom', 'upper' and 'lower' are used in the context of the accompanying figures rather then implying any particular restriction to the orientation of the security device.

If the height profile difference between various features in the microstructure is significant, the required etch depth becomes large and the etch process loses accuracy. Workers in this field will understand that deep etching suffers from the so called 'proximity effect' where dispersion of the radiation increases the further it travels into the photoresist layer. This causes chemical crosslinking in areas that are not meant to be removed by the etchant which reduces the resolution or accuracy of the microstructures formed. It will be appreciated that diffractive devices must be accurately formed in order to generate the required optical effect. To maintain accuracy, the deep etch can be performed in a series of shallow etch steps. Of course, this technique greatly increases the time and complexity of the process. With each etch step it is necessary to reapply and align a mask then etch away the exposed areas.

In light of the above issues, any security devices with microstructures that have significant height or height profile differences (say a diffraction grating and a much taller hologram structure) are separately formed on the originating master, and therefore spaced from each other by a minimum of about 10 mm. A security device with a diffraction grating immediately adjacent a hologram or perhaps completely surrounding a hologram (or vice versa) will provide a highly distinctive visual impression, as well as being exceptionally difficult for counterfeiters to replicate.

SUMMARY OF THE INVENTION

In view of the above, a first aspect of the present invention provides a hybrid security device for security documents and tokens, the hybrid security device comprising:

a substrate;

a first microstructure for a first optically variable device (OVD) supported on the substrate in a first region; and, a second microstructure for a second OVD supported on the substrate in a second region;

wherein the first and second regions are mutually interlaced or interspersed in at least one area; and the first microstructure has a height profile that differs from that of the second microstructure by more than 0.5 microns.

Preferably, the first microstructure has a maximum height above the substrate surface which differs from a maximum height of the second microstructures by more than 0.5 microns.

Preferably, the first and second regions are less than 5 mm apart.

Preferably, the first and second regions within the mutually interlaced or interspersed area are in the form of interspersed pixels of the first microstructure and the second microstructure, and each of the pixels have a maximum dimension of 1 mm in any direction.

Preferably, the first and second regions within the mutually interlaced or interspersed area are in the form of interleaved strips of the first microstructure and the second microstructure, each of the strips having a maximum width of 1 mm.

In one embodiment, the first OVD is a diffraction grating or a hologram and the second OV microstructure is a diffractive optical element (DOE).

In another embodiment, the first OVD is a micromirror array and the second microstructure is a DOE.

In a further embodiment, the first OVD is a micromirror array and the second microstructure is a diffraction grating or a hologram.

Preferably, the first and second OVD's are formed from an embossable radiation curable epoxy ink.

Preferably, the mutually interspersed area is encompassed by an area of the first microstructure only.

A second aspect of the present invention provides a method of producing a hybrid security device for a security document or token, the method comprising the steps of:

spinning a layer of negative photoresist on an underlying surface;

exposing the layer of negative photoresist to an electron beam to write a first stage of a first microstructure pattern and a second microstructure pattern;

developing the negative photoresist layer to remove unexposed areas of the negative photoresist such that an at least partial first microstructure and partial second microstructure remain;

spinning a subsequent layer of negative photoresist onto the plate to cover the at least partial first microstructure and the partial second microstructure;

exposing the subsequent photoresist layer to an electron beam to continue writing the first microstructure pattern if not completed in a previous exposure, and continue writing the second microstructure pattern;

developing the subsequent photoresist layer such that the first microstructure remains and the second partial microstructure remains;

spinning a final layer of negative photoresist onto the plate to cover the first microstructure and the partial second microstructure;

exposing the final negative photoresist layer to an electron beam to complete writing the second microstructure pattern;

developing the final layer of negative photoresist such that the first microstructure and second microstructure remain on the plate;

using the plate and the first and second microstructures to form a surface relief pattern with an inverse of the first and second microstructures; and using the surface relief pattern to emboss the first and second microstructures into an embossable layer to form the hybrid security device.

Preferably, the surface relief pattern is formed on a metal shim.

Preferably, the shim is formed by electroplating the first and second microstructures on the plate.

Preferably, the second microstructures are at least 0.5 μm taller than the first microstructures.

Preferably, the first microstructure has a height profile that differs from that of the second microstructure by more than 0.5 microns.

Preferably, at least one of the layers of negative photoresist is spun on to the plate to a thickness that differs from that of at least one other of the layers of negative photoresist.

Preferably, the first and second microstructures are used to form different types of OVD's, the types of OVD's being selected from:

(a) diffraction grating;

(b) hologram;

(c) diffractive optical element (DOE); and (d) micromirror array.

According to a third aspect, the present invention provides a method of producing a hybrid security device for a security document or token, the method comprising the steps of:

depositing a layer of negative photoresist on an underlying surface;

exposing the layer of photoresist to an electron beam to write one stage of a first microstructure pattern and/or a second microstructure pattern;

developing the layer of negative photoresist to remove unexposed areas;

repeating the deposition, exposure and development steps to build up the first and second microstructures in successive stages, the first and second microstructures each having at least one stage; wherein, a first stage of the first microstructure is deposited, exposed and developed after a first stage of the second microstructure, and/or final stage of the first microstructure is deposited, exposed and developed before a final stage of the second microstructure.

Preferably, the first microstructure forms a first OVD and has a first height profile and the second microstructure forms a second OVD having a second height profile, the second height profile being at least 0.5 microns taller than the first height profile.

Preferably, the first OVD is a diffraction grating and the second OVD is a diffractive optical element (DOE). This aspect of the hybrid security device recognises that the shorter of the two OVD's (i.e. the OVD with a significantly smaller height profile) can be formed at any height relative to the smaller OVD. For example, a diffraction grating will have a small height profile, compared to say, a diffractive optical element (DOE), but this aspect of the invention allows the diffraction grating to be formed at a height greater than that of the DOE. Skilled workers in this field will appreciate that this can be advantageous as a diffraction grating can be formed by a single stage that is approximately 0.5 microns high. In contrast, the DOE steps need to be more precisely formed to recreate the projected image properly. Therefore, the heights of each stage forming the DOE will vary significantly, particularly toward the type of DOE microstructure. Here the height of each individual stage may be relatively small. Therefore, it can be more efficient to form the diffraction grating in a single deposition, exposure and development process after the lithography of the DOE is complete.

Preferably, the first and second microstructures patterns are in first and second regions of the plate respectively, the first and second regions being mutually interlaced or interspersed in at least one area such that the first and second regions are less than 5 mm apart on the plate, and preferably less than 1 mm apart.

Preferably, the first microstructure has a height above the underlying surface less than that of the second microstructure.

Preferably, the first microstructure has a height above the underlying surface greater than that of the second microstructure.

According to another aspect, the present invention provides a method of producing a hybrid security device for a security document or token, the method comprising the steps of:
providing a fused silica (glass) substrate;
depositing photoresist on the substrate;
forming a mask in accordance with one stage of a first and/or a second microstructure;
exposing the photoresist with radiation through the mask;
developed the photoresist to remove areas of the photoresist and expose the substrate in accordance with said stage of the first and/or the second microstructures;
reactive ion etching said stage into the fused silica substrate;
repeating the deposition, masking, exposure, developing and reactive ion etching to successively etch the first and second microstructures into the fused silica substrate; wherein,
the first stage of the first microstructure is etched after the first stage of the second microstructure and/or the final stage of the first microstructure is etched before the final stage of the second microstructure.

Preferably, the first microstructure is formed in less stages than the second microstructure.

Preferably, the first microstructure has a height profile that differs from that of the second microstructure by more than 0.5 microns.

Preferably, the first and second microstructures are formed in first and second regions respectively, the first and second regions being mutually interlaced or interspersed in at least one area such that the first and second regions are less than 5 mm apart, and preferably less than 1 mm apart.

Preferably, the fused silica substrate is used to form a surface relief pattern that is the inverse of the first and second microstructures; and the surface relief pattern is used to emboss the first and second microstructures into an embossable layer to form the hybrid security device.

Preferably, the surface relief pattern is formed on a metal shim produced by electroplating the first and second microstructures etched into the fused silica substrate. This aspect of the invention recognises that the originating master for the hybrid security device can be formed by successively etching stages of the first and second microstructures into a glass substrate. This process requires a mask to be produced for each of the different stages of the first and second microstructure patterns. While this is time consuming, the need for time efficiency is much less critical in the production of an originating master. Skilled workers in this field will understand that time and cost efficiencies become far more relevant with the production of the security devices on the value documents themselves.

The invention provides a commercially practical hybrid security device with two different sets of microstructures having significantly different heights in very close proximity to each other, or even one inter-mingled within the other. Normally the originating master for producing these security devices uses a positive photoresist because the resulting structure is generally more robust as the bulk of the unexposed resist provides reinforcement to hold the pattern together. However, the present invention is based on the realisation that microstructures with significantly different heights can be simultaneously formed together on an originating master in a process that is relatively time efficient. Using a negative photoresist exposed to electron beam writing avoids need to use masking while the microstructures are accurately built up layer by layer. Alternatively, the originating master is formed from successive reactive ion etches into a glass substrate which is used to make a metal shim. It will be appreciated that this is fundamentally different from forming structures by deep etch removal of material that is not part of the structure thereby avoiding any problems with 'proximity effects'.

BRIEF DESCRIPTION OF THE DRAWINGS

Specific embodiments of the invention will now be described by way of example only with reference to the accompanying drawings, in which.

DETAILED DESCRIPTION OF PREFERRED EMBODIMENTS

Figure 1:
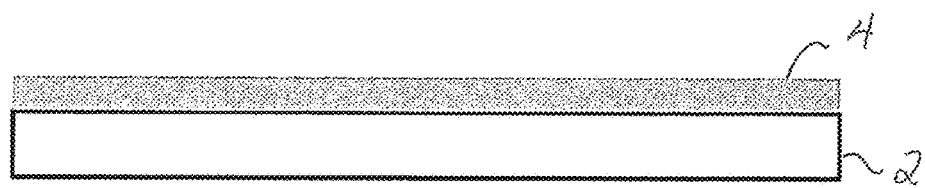
FIG. 1 is a schematic section view of the first stage of producing the originating master for a hybrid security device.

FIG. 1 shows the first step of producing the originating master which is used to create a metal shim that in turn embosses the security devices. A supporting plate 2 has a layer of negative photoresist 4 spun on to a depth of 0.5 microns.

Figure 2:
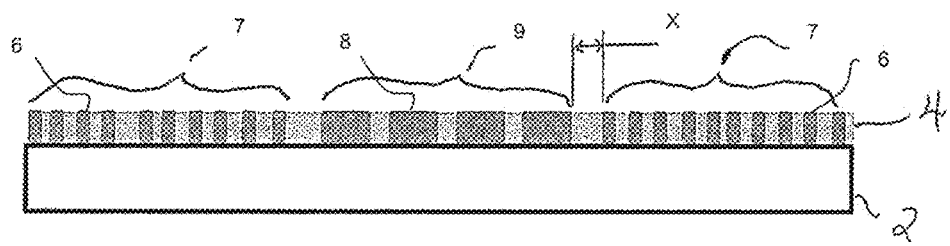
FIG. 2 is a schematic section view of the first layer of photoresist after exposure to the electron beam.

FIG. 2 shows the first layer of negative photoresist 4 after an electron beam has written the first stages of the first and second micropatterns (6 and 8 respectively) within first and second regions (7 and 9 respectively). As the first and second microstructures (6 and 8) are being formed in the same lithographic process, the first and second regions (7 and 9) can be positioned closely adjacent, or even intermingled within one another. The spacing between the first and second microstructures 'X' is less than 5 mm and typically less than 1 mm.

The first and second regions intermingle with each other in one or more areas on the plate. The regions may be interlaced such that strips of the first microstructure are interleaved with strips of the second microstructure. Similarly, the first and second regions may be mutually interspersed such that small patches or pixels of the first and second microstructures are dispersed within each other. In some cases, it may be necessary to have areas of interlaced strips as well as interspersed pixels.

For a hybridised visual effect, the first and second regions should be finely interlaced or interspersed. This is achieved by keeping the widths of the individual strips of first and second microstructures to less than 1 mm. Likewise, the interspersed pixels of first and second microstructure should be less than 1 mm in maximum dimension. In this way, the mutually interlaced or interspersed areas are perceived as generating a merged or hybrid visual effect rather than merely patches or lines of two different visual effects.

Figure 3:
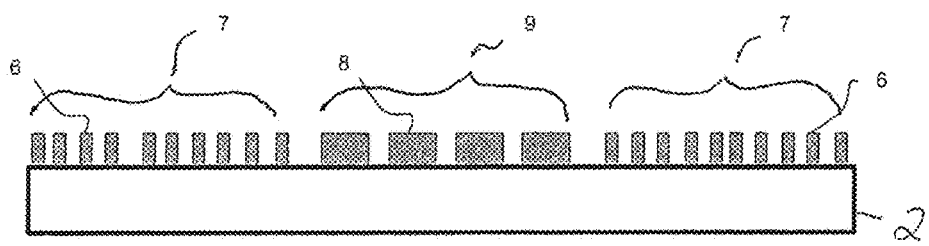
FIG. 3 is a schematic section view of the first stage of the first and second microstructures after the unexposed photoresist has been removed.

FIG. 3 is a schematic section view through plate 2 after the first layer of unexposed photoresist 4 has been removed by chemical etching. The first stage of the first and second microstructures (6 and 8) remains on the plate as 0.5 microns high structures.

Figure 4:
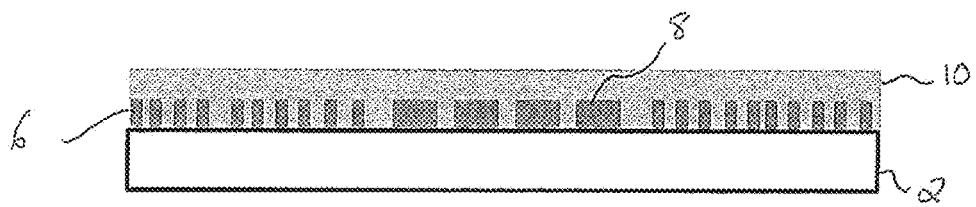
FIG. 4 is a schematic section view of the second layer of negative photoresist covering the first stage of the first and second microstructures.
Figure 5:
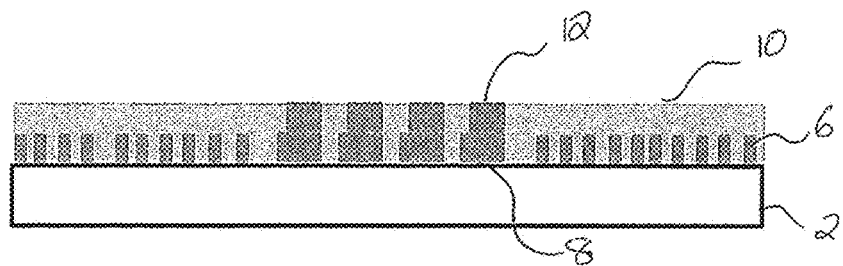
FIG. 5 is a schematic section view of the second layer of photoresist after exposure to the electron beam.
Figure 12:
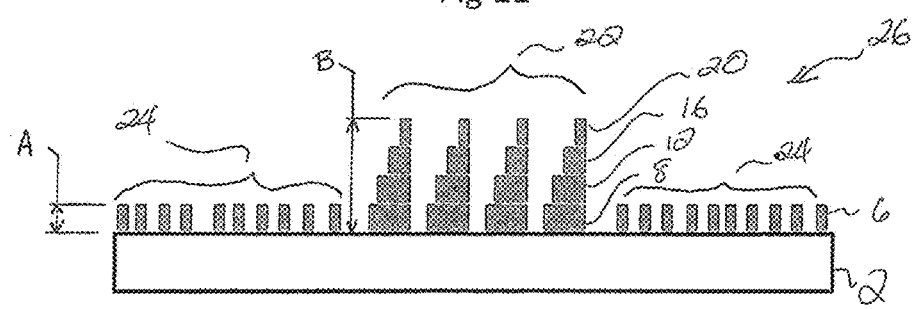
FIG. 12 is a schematic section view of the first microstructure surrounding the now complete second microstructure to provide the completed originating master.

In FIG. 4, a second layer of negative photoresist 10 is spun onto the plate 2 to cover the first stages (6 and 8) of the first and second microstructures. In this illustrative example, the first microstructure 24 (see FIG. 12) happens to be a diffraction grating and therefore it is complete after the formation of the 0.5 microns high gratings 6. The second microstructure 22 (see FIG. 12) is, in this case, a DOE or numerical hologram and therefore has a much taller profile. Accordingly, the electron beam writes (exposes) the second stage 12 of the second microstructure in the negative photoresist 10 as shown in FIG. 5.

Figure 6:
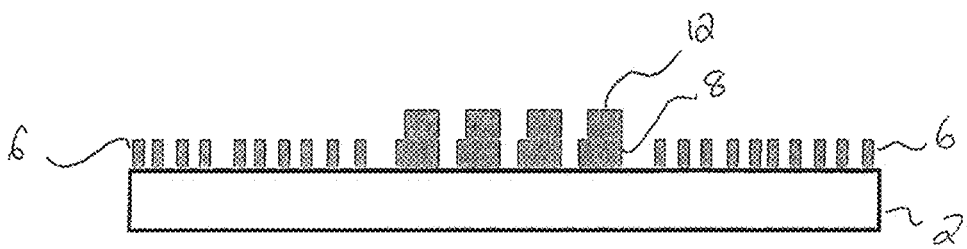
FIG. 6 is a schematic section view of the first stage of the first microstructure and the first and second stages of the second microstructure revealed after the unexposed second photoresist layer has been removed.

FIG. 6 shows the first and final stage of the microstructures 6 and the first and second stages (8 and 12) of the second microstructure revealed once the second layer of photoresist 10 has been etched away.

Figure 7:
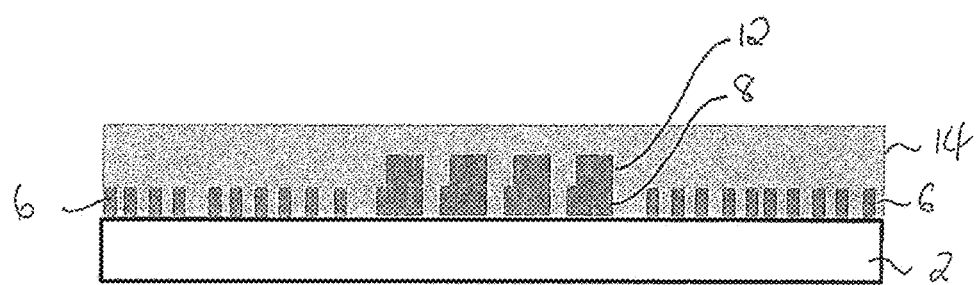
FIG. 7 is a schematic section view of a third layer of negative photoresist covering the first microstructure and the first and second stages of the second microstructure.

Referring to FIG. 7, a third layer 14 of negative photoresist is spun onto the plate 2 to a depth of 1.5 microns in order to cover the gratings 6 of the first microstructure and the first and second stages (8 and 12) of the second microstructure.

Figure 8:
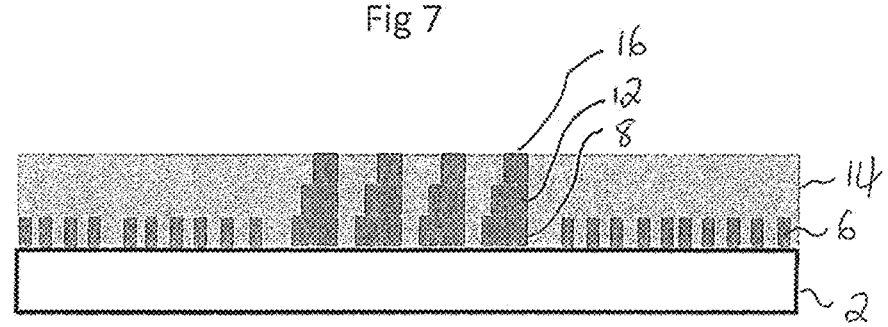
FIG. 8 is a schematic section view of the third layer of negative photoresist after exposure to the electron beam.
Figure 9:
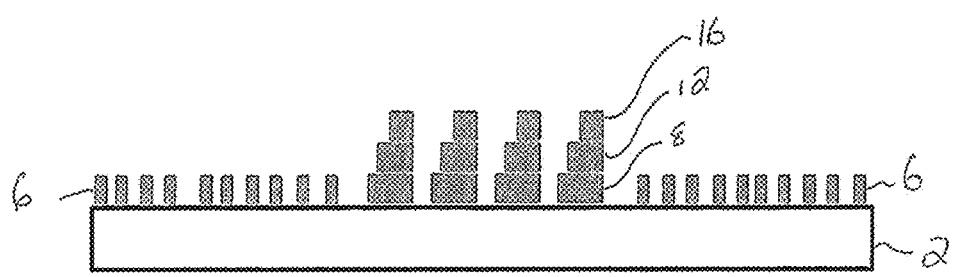
FIG. 9 is a schematic section view of the first microstructure and the first three stages of the second microstructure revealed after the unexposed photoresist is removed.

In FIG. 8, the third stage 16 of the second microstructure has been written into the third layer of photoresist 14. Then in FIG. 9, the photoresist is etched away to reveal the gratings 6 of the first microstructure and the first three stages (8, 12 and 16) of the second microstructure.

Figure 10:
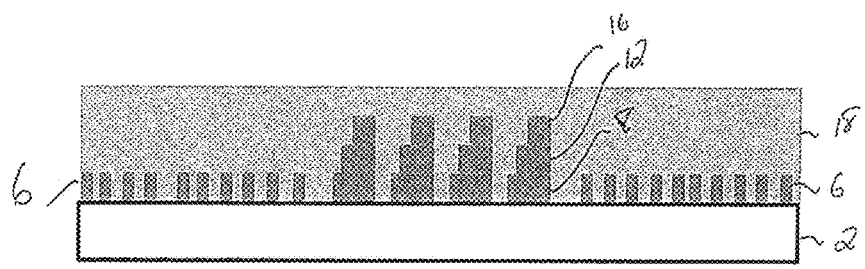
FIG. 10 is a schematic section view of a fourth layer of negative photoresist covering the first microstructure and the first three stages of the second microstructure.

FIG. 10 shows the fourth layer of photoresist 18 spun onto the plate 2—this time to a depth of 2 microns. A 2 micron layer of resist is relatively thick in photolithographic terms but necessary in order to cover the first, second and third stages (8, 12 and 16) of the second microstructure.

Figure 11:
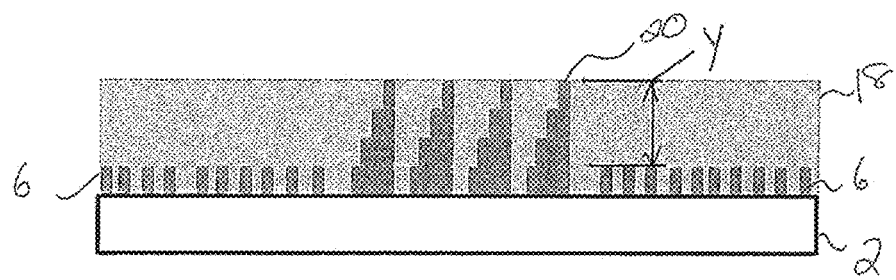
FIG. 11 is a schematic section view showing the fourth layer of photoresist after exposure to the electron beam.

In FIG. 11, the electron beam writes the final stage 20 of the second microstructure into the fourth layer of photoresist 18. The height difference between the first and second microstructures is shown as Y which in this case is 1.5 microns. Once the photoresist 18 is etched away, the completed master 26 with the first and second microstructures (24 and 22 respectively) located closely adjacent each other, and/or intermingled within each other despite the first microstructure 24 having a height profile A much less than the height profile B of the second microstructure.

Were the same microstructures to be etched from positive photoresist, the dispersion of the UV light at greater etched depths (say greater than 1 μm) would generate proximity effects. As discussed above, proximity effects reduce the accuracy of the exposure step and therefore the resulting microstructure is less precise.

Of course, the deposition thickness of the photoresist does not need to be 0.5 microns. It is usually varied to suit the profile of the micro- or nanostructures to be formed. For example, the last few stage heights in a hologram are usually small—perhaps (say) 0.2 microns. Naturally the intensity of the electron beam is tuned to the required exposure depth.

With the completed original master 26, a metal shim can be formed by electroplating the plate 2 and microstructures 22 and 24. Typically nickel is used to form the required shim. The shim is a precise inverse of the first and second microstructures (24 and 22 respectively) formed as a surface relief pattern. This surface relief pattern is used to emboss the security devices into the individual security documents.

The security device usually has a layer of UV curable epoxy ink which is embossed by the shim before it is cured. After curing the microstructures are set and the security device is often encased under a transparent protective layer.

Figure 13:
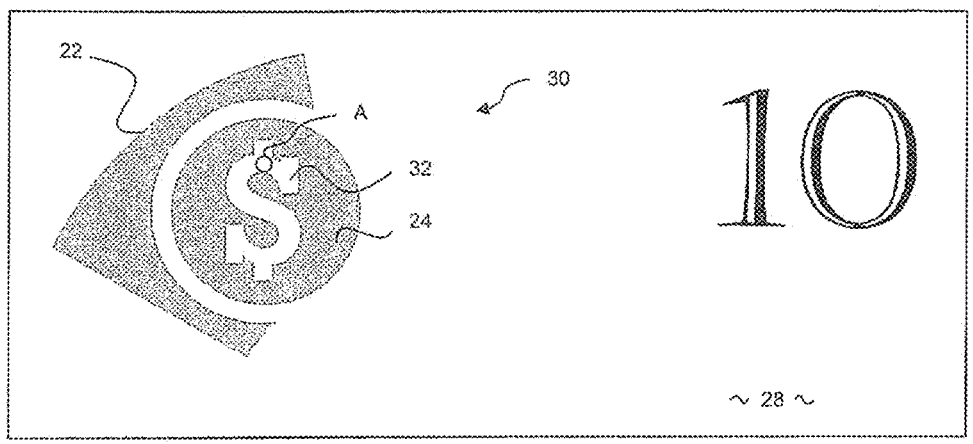
FIG. 13 is a schematic view of a banknote with a hybrid security device.

As shown in FIG. 13, a banknote 28 has a security device 30 formed in accordance with the present invention. The first microstructure 24 is a diffraction grating occupying a circular area. The second microstructure 22 is a DOE or micromirror array and occupies a second region of the hybrid security device 30. However, in the dollar sign shaped area 32, the first and second regions with first and second microstructures respectively are interlaced or interspersed.

Figures 14A, 14B:
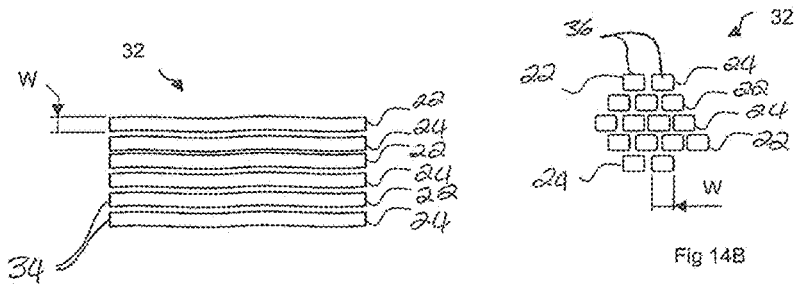
FIG. 14A is a schematic enlarged view of Inset A shown in FIG. 13.
FIG. 14B is an alternative schematic enlarged view of the Inset A shown in FIG. 13.

FIG. 14A is a schematic enlargement of Inset A shown in in FIG. 13. Here the first and second regions of the first and second microstructures (24 and 22 respectively) are in the form of interleaved strips 34. As previously discussed, the width W of these strips 34 are less than 1 mm so that the eye perceives a hybrid visual effect generated by the first and second microstructures (24 and 22). Wider strips would be seen as alternating lines of the visual effect from the first microstructures 24 and the visual effect of the second microstructures 22.

FIG. 14B shows another form of the interlaced or interspersed area 32. In this form, the first and second microstructures (24 and 22) are in first and second regions formed as small patches or pixels 36. Once again, the pixels 36 have a maximum dimension W of 1 mm so that the hybrid visual effect is generated instead of a 'checkerboard' of the visual effect from the first microstructure 24 and the visual effect from the second microstructure 22.

It will be appreciated that the hybrid security device 30 can have several mutually interlaced or interspersed areas 32 and that the first and second regions within these areas may be in the form of both strips and pixels or other shapes. Furthermore, the hybrid security device 30 may have more than two different types of microstructure and may generate a hybrid effect from three or more different types of OVD's. The hybrid visual impression created by two or more different OVD's is highly distinctive and exceptionally difficult for the counterfeiter to replicate.

Figure 15:
FIGS. 15 to 22 schematically illustrate the fabrication of an originating master for a hybrid security device with diffraction gratings formed at the same height as a DOE.

FIGS. 15 to 22 are a schematic illustration of the lithographic fabrication of an originating master for a hybrid security device with a diffraction grating formed at the same height as the top of a diffractive optical element; the process begins with a supporting plate 2 with a layer of negative photoresist spun onto the upper surface to a depth of 0.5 microns as shown in FIG. 15.

Figure 16:
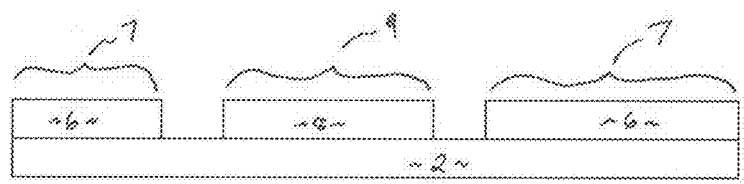

FIG. 16 shows the first layer of negative photoresist before and after an electron beam has written the first stage 8 of the second microstructure in a second region 9. In contrast to the process shown in FIGS. 1 to 12, the photoresist 6 in the first region 7 is not the first stage of the first microstructure, but rather just a supporting layer that will lie beneath the first microstructure in the completed originating master (see FIG. 22).

Figure 17:
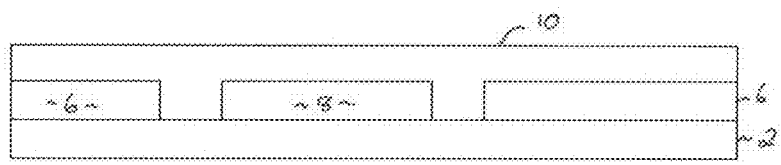
Figure 18:
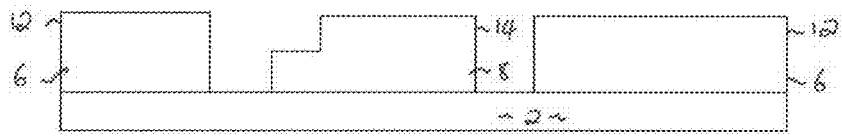

In FIG. 17, a second layer of photoresist is deposited over the supporting layer 6 of the first microstructure and the first stage 8 of the second microstructure. The electron beam exposes the photoresist to write the second stage 14 of the second microstructure and expose the second supporting layer 12 of the first microstructure (see FIG. 18).

Figure 19:
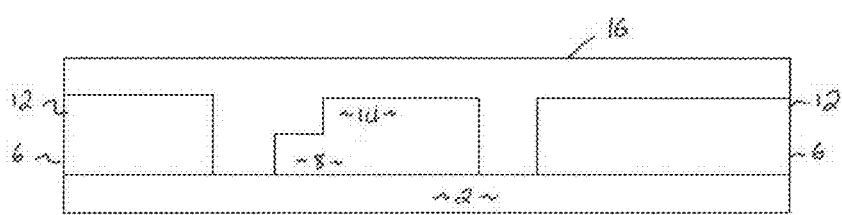

FIG. 19 shows the third layer of photoresist covering the second supporting layer 12 of the first microstructure and the second stage 14 of the second microstructure.

Figure 20:
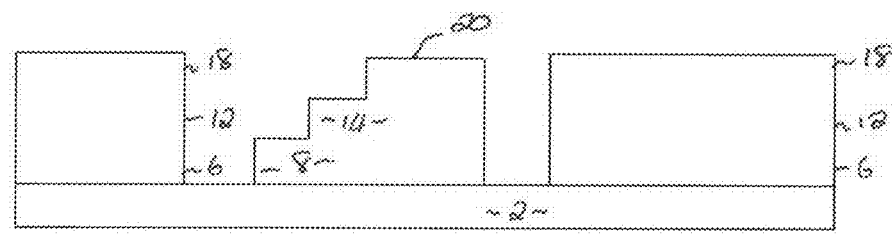

FIG. 20 shows the third supporting layer 18 of the first microstructure and the third stage 20 of the second microstructure after exposure to the electron beam writer and development to remove unexposed photo resist.

Figure 21:
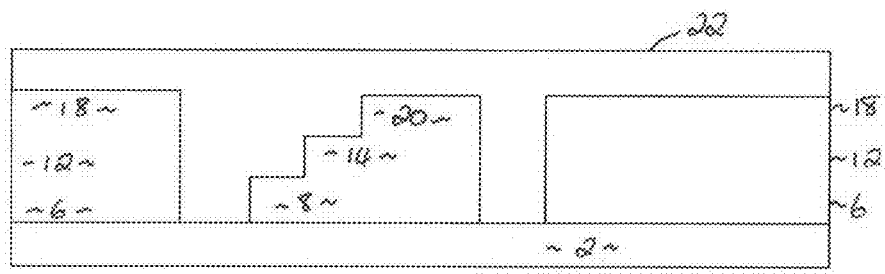

Then as shown in FIG. 21, the third supporting layer 18 of the first microstructure, and the third stage of 20 of the second microstructure is covered with photoresist 22. The photoresist 22 is exposed to the electron beam writer.

Figure 22:
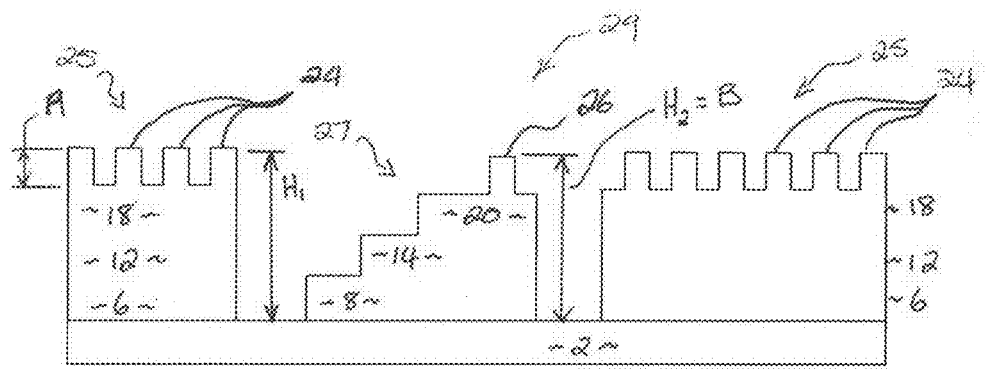

As shown in FIG. 22, the electron beam writer exposes the first and final stage 24 of the first microstructure 25 as well as the fourth and final stage 26 of the second microstructure 27.

The height profile A of the first microstructure 25 is much lower than the height profile B of the second microstructure 27 but the underlying support layers 6, 12 and 18 allow the height H1 of the first microstructure 25 to be the same as the height H2 of the second microstructure 27.

Figure 23:
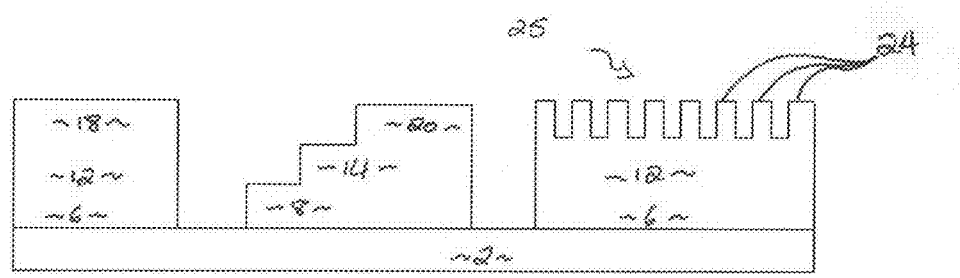
FIGS. 23 and 24 schematically illustrate the fabrication of an originating master for a hybrid security device that has diffraction gratings at different levels.
Figure 24:
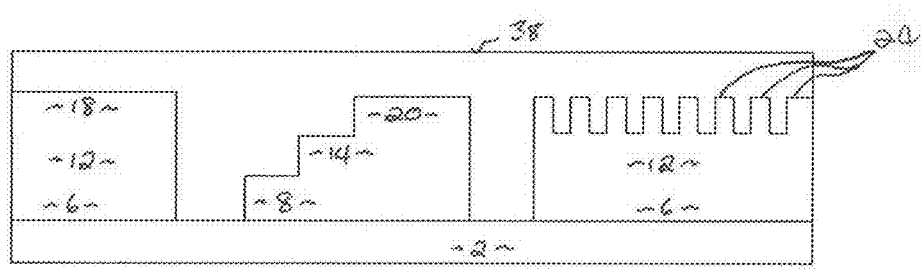

FIGS. 23 to 27 schematically illustrate the fabrication steps for an originating master to produce a hybrid security element with two diffraction gratings formed at different levels relative to the diffractive optical element;

FIGS. 23 and 24 schematically illustrate the situation where the first microstructure 25 is formed at any arbitrary level of the supporting plate 2. In this case, the diffraction gratings 24 of the first microstructure 25 are supported on only two underling layers 6 and 12. The process of building up the other microstructures 27 and 31 can continue as per the process steps as described above.

Figure 25:
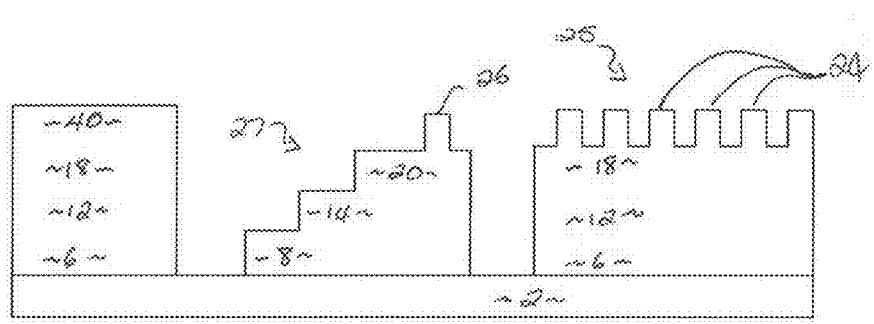
FIGS. 25 to 27 schematically illustrate the fabrication of a originating master for a hybrid security device in which a diffraction grating is formed on a level higher than any other OVD.
Figure 26:
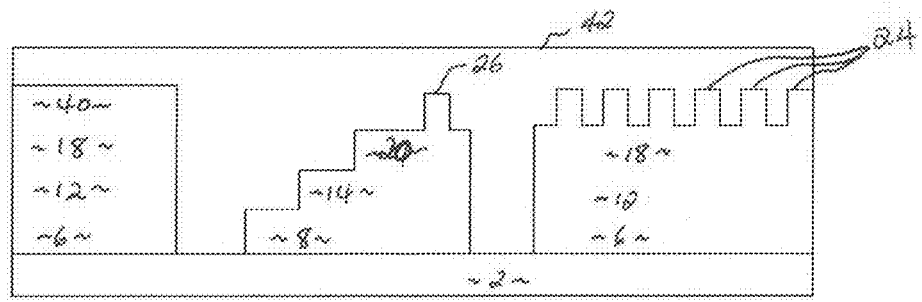
Figure 27:
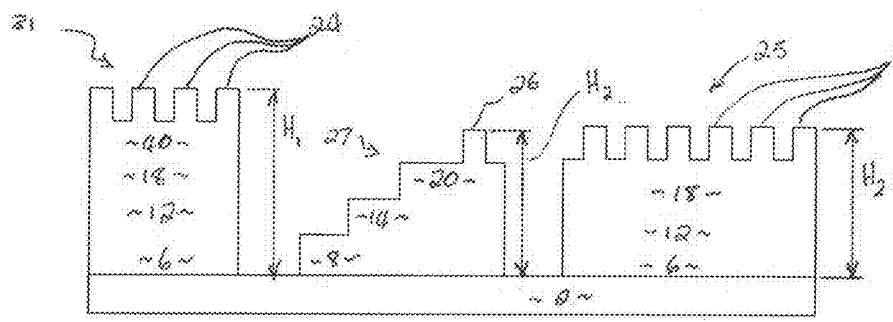

As shown in FIGS. 25, 26 and 27 a third microstructure 31 with diffraction gratings 24 can be formed at a height of H1 above the height H2 of the first and second microstructures (25 and 27 respectively). The first and final stage 24 of the third microstructure 31 occurs after the final stage 26 of the second microstructure 27 by simply providing as many underlying support layers (6, 12, 18 and 4) needed to achieve the required height.

FIGS. 28 to 36 schematically illustrate the fabrication steps for an originating master of a hybrid security element with two or more OVD's having height profiles. This process relies on a series of reactive ion etches (RIE) into a fused silica (glass) substrate 2. This process requires a series of photo masks 44 formed from a suitable material such as chromium. Skilled workers in this field will understand that the masks are fabricated by spinning a layer of photo resist onto a layer of chromium. The photo resist is exposed to radiation such as an e-beam writer then developed to remove areas of the photoresist and expose the surface of the chrome photo mask 44 in the pattern of the first and second microstructures. A suitable etchant is used to form openings 48 through the chrome layer to complete the chrome photo mask 44.

Figure 28:
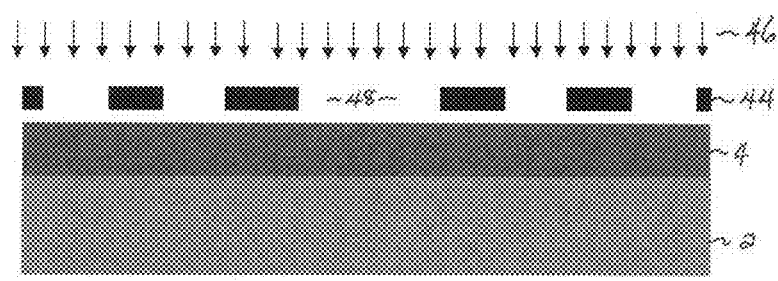
FIGS. 28 to 36 schematically illustrate the fabrication of an originating master for a hybrid security device in which the stages of the microstructures are successively etched into the surface of a fused silica (glass) substrate.
Figure 29:
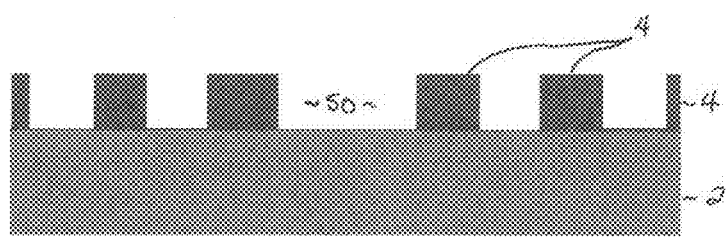

As shown in FIG. 28, the glass substrate 2 is coated with a layer of photo resist 4 which is exposed to UV radiation 46 through the photo mask 44. The photo resist 4 is exposed through openings 48. The exposed areas of photoresist are removed by suitable etchant to create voids 50 (as shown in FIG. 29).

Figure 30:
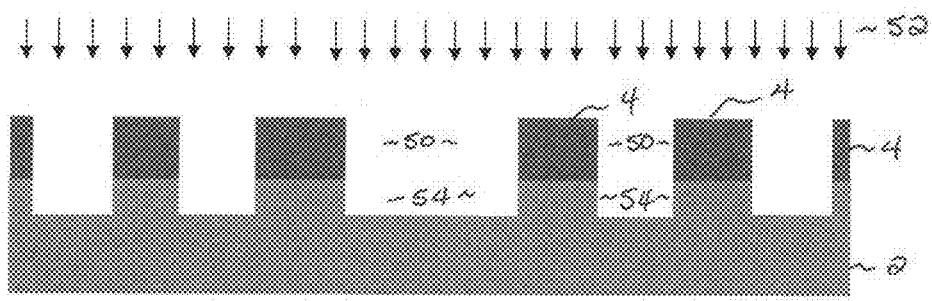

Referring to FIG. 30, the glass substrate 2 is subjected to a reactive ion etch (RIE) 52 using suitable ions such as argon ions accelerated through an appropriate gas environment. The exposed areas 54 beneath the voids 50 in the photoresist 4 are etched to a closely controlled depth.

Figure 31:
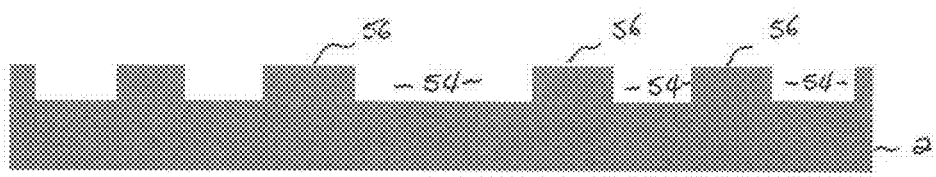

As shown in FIG. 31, the remaining areas of photo resist 4 are stripped away using oxygen plasma leaving raised structures 56 between the etched recesses 54.

Figure 32:

Then, as shown in FIG. 32, the process is repeated for the next reactive ion etch into the glass substrate 2. The second layer of photo resist 58 is spun onto the glass substrate to a depth covering the raised features 56.

Figure 33:
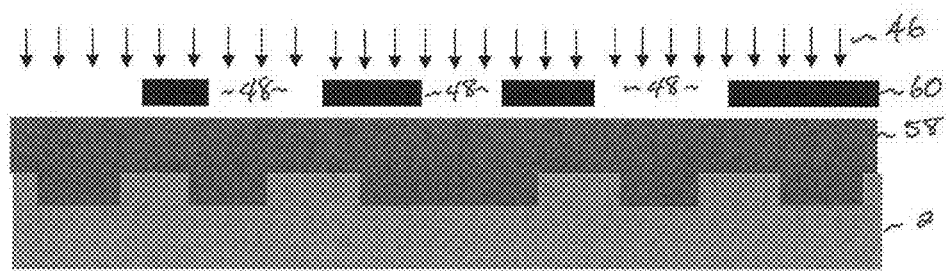
Figure 34:
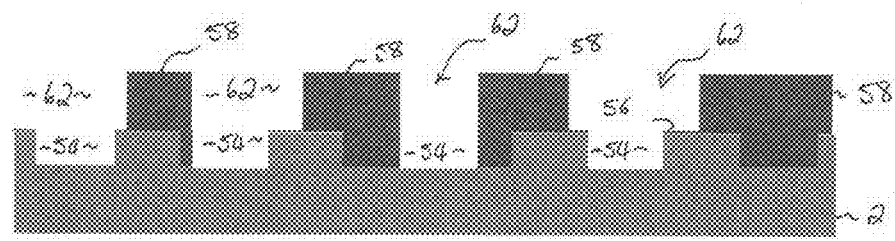

Referring to FIG. 33, the second chrome photo mask 60 is placed over the photo resist 58 and exposed to UV radiation 46. The areas exposed to the UV light through openings 48 in the mask 60 are removed to create voids 62 in the second photo resist layer 58 as shown in FIG. 34.

Figure 35:
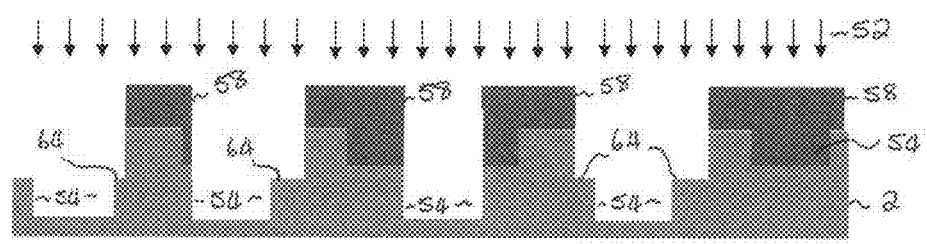

As shown in FIG. 35, a second reactive ion etch 52 further deepens the recesses 54 while creating new recesses for stepped features 54 in the glass substrate 2.

Figure 36:
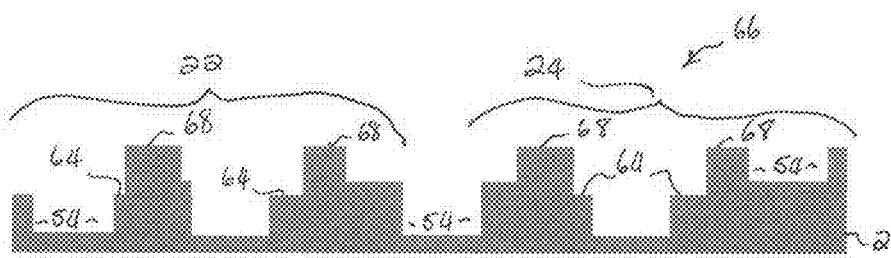

As shown in FIG. 36, the remaining areas of the second photo resist layer 58 are stripped away with oxygen plasma (also called 'ashing'). As with the first and second reactive ion etches 52, the associated recesses 54 and 64, together with the raised areas 68 form the required first and second microstructures 22 and 24 on the originating master 66. Of course, in reality, far more than two RIE steps will be used to create the master 66 and the complex first and second microstructures (24 and 22) thereon.

As illustrated in FIGS. 28 to 36, each RIE is a binary process and therefore after only two etches, the glass substrate 2 is supporting four level microstructures. Accordingly, if the process is repeated n times using n different masks, the microstructures will have $2^n$ different levels.

The above RIE method is well suited to fabricating structures such as DOEs that are 'refractive index matched'. Refractive index matching refers to changing a diffractive microstructure (generally by increasing the height profile) to account for the effective change in refractive index of the microstructure material when covered by a protective coating. Diffractive microstructure material typically has a refractive index about 1.5. When coated, this can shift by about 0.3 which causes the constructive and destructive interference to shift position and large errors result. Hence the original microstructure is formed (the height and step heights are increased) to account for the shift. In light of this, diffractive structures that are refractive index matched are around 2.5 microns in depth and are typically an eight level structure. Using e-beam lithography, each individual exposure step can form a structure around one micron high. Therefore, to build up structures that approximately 2.5 microns high using e-beam lithography is not as time and cost efficient as the above RIE process.

Traditionally, if a security element for a value document were to include a DOE adjacent a DOVD (diffractive optically variable device), the DOE would be made by RIE and the DOVD by a normal e-beam lithographic process. These two component devices would then go to a recombination process resulting in a large gap between the two which can often be around 2 centimeters apart.

The techniques developed by the present invention allow incorporation of the diffractive grating into any selected level of the negative resist (if using the e-beam lithography technique), or one level of the RIE process in order to eliminate the gap and permit the two different devices to be interspersed or interlaced.

Comprises/comprising and grammatical variations thereof when used in this specification are to be taken to specify the presence of stated features, integers, steps or components or groups thereof, but do not preclude the presence or addition of one or more other features, integers, steps, components or groups thereof.

The invention has been described herein by way of example only. Skilled workers in this field will readily recognise many variations and modifications which do not depart from the spirit and scope of the broad inventive concept.

The claims defining the invention are as follows:

1. A hybrid security device for security documents and tokens, a hybrid security device comprising:
    a substrate;
    a first microstructure for a first optically variable device (OVD) supported on the substrate in a first region; and,
    a second microstructure for a second OVD supported on the substrate in a second region;
    wherein the first and second regions are mutually interlaced or interspersed in at least one area; and
    the first microstructure has a height profile that differs from that of the second microstructure by more than 0.5 microns;
    wherein the first microstructure is a micromirror array and the second microstructure is a DOE or a diffraction grating.

2. A hybrid security device according to claim 1 wherein the first microstructure has a maximum height above the substrate surface which differs from a maximum height of the second microstructure by more than 0.5 microns.

3. A hybrid security device according to claim 1 wherein the first and second regions are less than 5 mm apart.

4. A hybrid security device according to claim 1 wherein the first and second regions within the mutually interlaced or interspersed area are in the form of interspersed pixels of the first micro-structure and the second microstructure, and each of the pixels have a maximum dimension of 1 mm in any direction.

5. A hybrid security device according to claim 1, wherein the first and second regions within the mutually interlaced or interspersed area are in the form of interleaved strips of the first microstructure and the second microstructure, each of the strips having a maximum width of 1 mm.

6. A hybrid security device according to claim 1, wherein the first microstructure is a diffraction grating or a hologram and the second microstructure is a diffractive optical element (DOE).

7. A hybrid security device according to claim 1, wherein the first and second microstructures are formed from an embossable radiation curable epoxy ink.

8. A hybrid security device according to claim 1, wherein the mutually interspersed area is encompassed by an area of the first microstructure only.

9. A method of producing a hybrid security device for a security document or token, the method comprising the steps of:
    spinning a layer of negative photoresist on an underlying surface;
    exposing the layer of negative photoresist to an electron beam to write a first stage of a first microstructure pattern and a second microstructure pattern;
    developing the negative photoresist layer to remove unexposed areas of the negative photoresist such that an at least partial first microstructure and partial second microstructure remain;
    spinning a subsequent layer of negative photoresist onto the plate to cover the at least partial first microstructure and the partial second microstructure;
    exposing the subsequent photoresist layer to an electron beam to continue writing the first microstructure pattern if not completed in a previous exposure, and continue writing the second microstructure pattern;

developing the subsequent photoresist layer such that the first microstructure remains and the second partial microstructure remains;

spinning a final layer of negative photoresist onto the plate to cover the first microstructure and the partial second microstructure;

exposing the final negative photoresist layer to an electron beam to complete writing the second microstructure pattern;

developing the final layer of negative photoresist such that the first microstructure and second microstructure remain on the plate;

using the plate and the first and second microstructures to form a surface relief pattern with an inverse of the first and second microstructures; and using the surface relief pattern to emboss the first and second microstructures into an embossable layer to form the hybrid security device.

10. A method according to claim 9, wherein the surface relief pattern is formed on a metal shim.

11. A method according to claim 10, wherein the shim is formed by electroplating the first and second microstructures on the plate.

12. A method according to claim 9, wherein the second microstructures are at least 0.5 microns taller than the first microstructures.

13. A method according to claim 9, wherein at least one of the layers of negative photoresist is spun on to the plate to a thickness that differs from that of at least one other of the layers of negative photoresist.

14. A method according to claim 9, wherein the first and second microstructures are used to form different types of optically variable (OV) device, the types of OV device being selected from:

(a) diffraction grating;
(b) hologram;
(c) diffractive optical element (DOE); and
(d) micromirror array.

15. A method of producing a hybrid method of producing a hybrid security device for a security document or token, the method comprising the steps of:

depositing a layer of negative photoresist on an underlying surface;

exposing the layer of photoresist to an electron beam to write one stage of a first microstructure pattern and/or a second microstructure pattern;

developing the layer of negative photoresist to remove unexposed areas;

repeating the deposition, exposure and development steps to build up the first and second microstructures in successive stages, the first and second microstructures each having at least one stage; wherein, a first stage of the first microstructure is deposited, exposed and developed after a first stage of the second microstructure, and/or final stage of the first microstructure is deposited, exposed and developed before a final stage of the second microstructure.

16. A method according to claim 15 wherein the first microstructure forms a first OVD and has a first height profile and the second microstructure forms a second OVD having a second height profile, the second height profile being at least 0.5 microns taller than the first height profile.

17. A method according to claim 16 wherein the first OVD is a diffraction grating and the second OVD is a diffractive optical element (DOE).

18. A security document incorporating a hybrid security device according to claim 1.

* * * * *